(12) United States Patent
Lu et al.

(10) Patent No.: US 9,997,479 B1
(45) Date of Patent: Jun. 12, 2018

(54) METHOD FOR MANUFACTURING REDISTRIBUTION LAYER

(71) Applicant: TAIWAN SEMICONDUCTOR MANUFACTURING CO., LTD., Hsinchu (TW)

(72) Inventors: Szu-Hsien Lu, Tainan (TW); Chiang-Ming Chuang, Changhua County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days. days.

(21) Appl. No.: 15/405,384

(22) Filed: Jan. 13, 2017

Related U.S. Application Data (60) Provisional application No. 62/427,938, filed on Nov. 30, 2016.

(51) Int. Cl.
*H01L 23/00* (2006.01)

(52) U.S. Cl.
CPC ........ *H01L 24/02* (2013.01); *H01L 2224/024* (2013.01); *H01L 2224/0235* (2013.01); *H01L 2224/0239* (2013.01); *H01L 2224/02215* (2013.01); *H01L 2224/02311* (2013.01); *H01L 2224/02313* (2013.01); *H01L 2224/02321* (2013.01); *H01L 2224/02381* (2013.01); *H01L 2924/01013* (2013.01); *H01L 2924/01029* (2013.01); *H01L 2924/0132* (2013.01); *H01L 2924/059* (2013.01); *H01L 2924/05042* (2013.01); *H01L 2924/05442* (2013.01)

(58) Field of Classification Search
USPC .......................................................... 257/771
See application file for complete search history.

(56) References Cited

U.S. PATENT DOCUMENTS

| | | | | |
|---|---|---|---|---|
| 5,902,127 | A * | 5/1999 | Park | H01L 21/76232 148/DIG. 50 |
| 6,218,268 | B1 * | 4/2001 | Xia | C23C 16/045 257/E21.275 |
| 7,033,945 | B2 * | 4/2006 | Byun | H01L 21/76224 257/E21.546 |
| 7,211,525 | B1 * | 5/2007 | Shanker | C23C 16/0245 257/E21.279 |

(Continued)

*Primary Examiner* — Julio J Maldonado
*Assistant Examiner* — Lawrence Tynes, Jr.
(74) *Attorney, Agent, or Firm* — McClure, Qualey & Rodack, LLP (57) ABSTRACT

In a method for manufacturing a semiconductor device, a semiconductor substrate having a top surface is provided. A top metal layer is formed in the top surface. A first passivation layer is formed to cover the top metal layer and the top surface. The first passivation layer has a via hole exposing a portion of the top metal layer. A redistribution layer is formed to cover the first passivation layer, the portion of the top metal layer, and a side surface of the via hole. The redistribution layer includes an overhang structure over the via hole. An etching process is performed on the redistribution layer to remove the overhang structure and a portion of the redistribution layer to expose a portion of the first passivation layer. A second passivation layer is formed to cover the redistribution layer and the portion of the first passivation layer.

20 Claims, 7 Drawing Sheets

(56) References Cited

U.S. PATENT DOCUMENTS

| | | | | |
|---|---|---|---|---|
| 7,964,504 B1* | 6/2011 | Shaviv | ............... | C23C 14/046 |
| | | | | 257/E21.17 |
| 2002/0006729 A1* | 1/2002 | Geiger | ............. | H01L 21/02129 |
| | | | | 438/698 |
| 2003/0066482 A1* | 4/2003 | Pokharna | ............. | C23C 16/401 |
| | | | | 118/696 |
| 2005/0136684 A1* | 6/2005 | Mukai | ................ | C23C 16/045 |
| | | | | 438/778 |
| 2005/0285269 A1* | 12/2005 | Cao | ................ | H01L 21/76877 |
| | | | | 257/758 |
| 2008/0113508 A1* | 5/2008 | Akolkar | ........... | H01L 21/76843 |
| | | | | 438/687 |
| 2012/0306070 A1* | 12/2012 | Yew | ..................... | H01L 24/05 |
| | | | | 257/737 |
| 2015/0093907 A1* | 4/2015 | Yieh | ............... | H01L 21/67017 |
| | | | | 438/758 |
| 2016/0276214 A1* | 9/2016 | Fu | ................... | H01L 21/76816 |

* cited by examiner

METHOD FOR MANUFACTURING REDISTRIBUTION LAYER

RELATED APPLICATIONS

This application claims priority to U.S. Provisional Application Ser. No. 62/427,938, filed Nov. 30, 2016, which is herein incorporated by reference.

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased.

With the continuous decrease in feature size of integrated circuits, a flip chip package technology become more widespread because the flip chip package technology is applicable to very high density I/O connections and has high reliability in interconnects. However, the conventional flip chip package technology has not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical process for manufacturing a redistribution layer of a top metal layer or a bonding layer, a redistribution layer depositing on a first passivation layer and covering a redistribution via (RV) hole formed in the first passivation layer has an overhang structure above the redistribution via hole due to poor coverage of the redistribution layer. Therefore, when a second passivation layer is deposited to cover the redistribution layer, voids are formed in the second passivation layer under the overhang structure, and thus resulting in a pinhole fail of a semiconductor device.

Embodiments of the present disclosure are directed to providing a method for manufacturing the semiconductor device, in which a redistribution layer is formed to cover a first passivation layer and a via hole formed in the first passivation layer, and an etching process is performed on the redistribution layer to pattern the redistribution layer into various pads and to remove an overhang structure of the redistribution layer above the via hole. The overhang structure of the redistribution layer is removed to form the redistribution layer having a V-shaped or a U-shaped cavity above the via hole. Therefore, when a second passivation layer is deposited to cover the redistribution layer, the second passivation layer has better coverage, such that no void is formed in the second passivation layer, thereby enhancing reliability of the semiconductor device and increasing yield of the method for manufacturing the semiconductor device.

Figure 1:
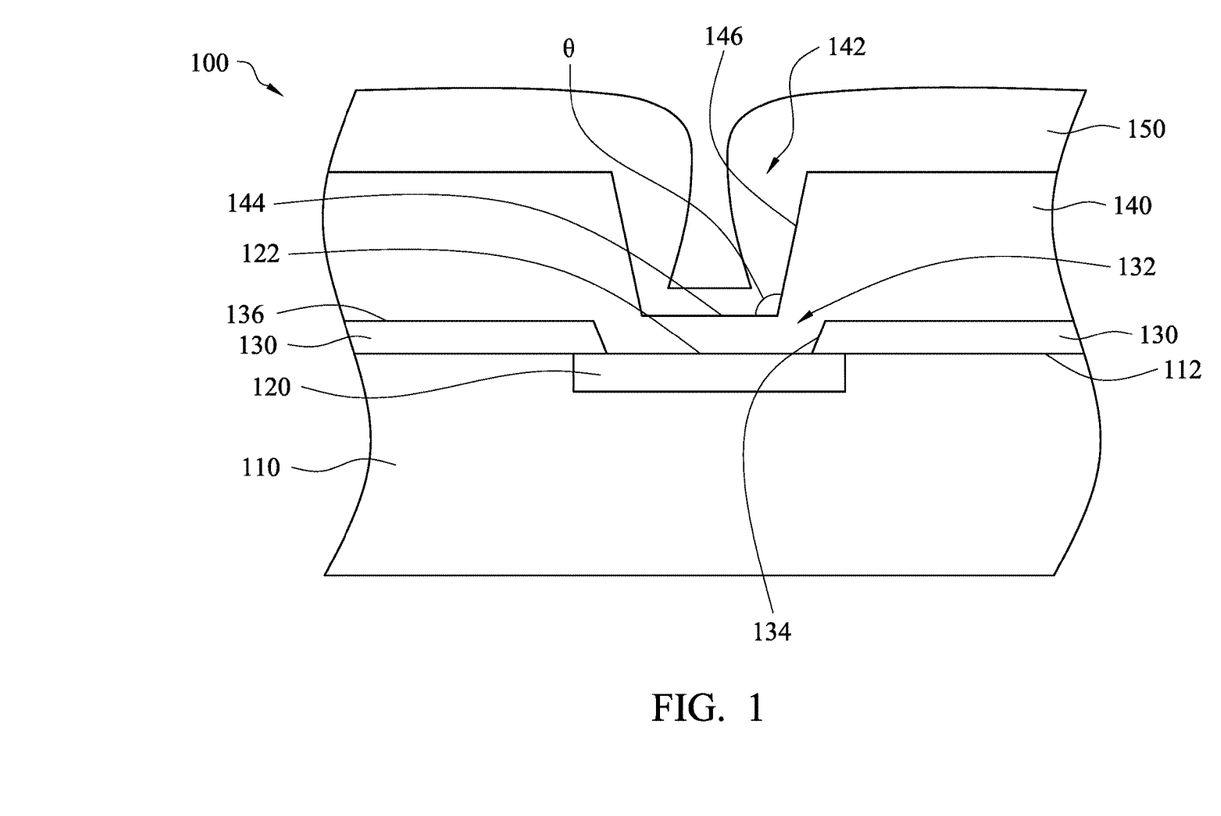
FIG. 1 is a schematic cross-sectional view of a semiconductor device in accordance with various embodiments.

FIG. 1 is a schematic cross-sectional view of a semiconductor device in accordance with various embodiments. In some embodiments, a semiconductor device 100 includes a semiconductor substrate 110, a top metal layer 120, a first passivation layer 130, a redistribution layer 140, and a second passivation layer 150. The semiconductor substrate 110 may include a semiconductor base, one or more devices, various interlayer dielectric layers, and various interconnection layers, in which the devices may be disposed on the semiconductor base, the interlayer dielectric layers cover the semiconductor base and the devices, and the interconnection layers are disposed in or between the interlayer dielectric layers and are electrically connected to the devices. The semiconductor base may be composed of a single-crystalline semiconductor material or a compound semiconductor material. For example, silicon or germanium may be used as a material forming the semiconductor base. In certain examples, the semiconductor base may be a silicon on insulator (SOI) base. The semiconductor substrate 110 has a top surface 112.

As shown in FIG. 1, the top metal layer 120 is disposed in the top surface 112 of the semiconductor substrate 110. The top metal layer 120 may be the top one of the interconnection layers. In some examples, the top metal layer 120 is a metal bonding layer which includes various bonding pads separated from each other. In For example, the top metal layer 120 may be formed from Cu, Al, or AlCu.

Referring to FIG. 1 again, the first passivation layer 130 covers the top surface 112 of the semiconductor substrate 110 and the top metal layer 120. The first passivation layer 130 has at least one via hole 132, in which the at least one via hole 132 passes through the first passivation layer 130 to expose at least one portion 122 of the top metal layer 120. In some exemplary examples, the top metal layer 120 includes various bonding pads, and the first passivation layer 130 has various via holes 132 respectively exposing the bonding pads. For example, the first passivation layer 130 may be formed from silicon oxide, silicon nitride, or silicon oxynitride.

As shown in FIG. 1, the redistribution layer 140 covers the first passivation layer 130, the portion 122 of the top metal layer 120 which is exposed by the via hole 132, and a side surface 134 of the via hole 132. In some exemplary examples, the redistribution layer 140 is a redistribution bonding pad layer, in which the redistribution layer 140 has at least one through hole passing through the redistribution layer 140 to expose at least one portion of the first passivation layer 130 so as to divide the redistribution layer 140 into various redistribution bonding pads. The redistribution layer 140 has at least one cavity 142 which is correspondingly located over the at least one via hole 132 of the first passivation layer 130. The cavity 142 has a bottom surface 144 and a side surface 146. In some examples, the cavity 142 of the redistribution layer 140 is V-shaped or U-shaped. In some exemplary examples, an included angle 9 between the side surface 146 and the bottom surface 144 of the cavity 142 is equal to about 90 degrees or greater than about 90 degrees. In some certain examples, the bottom surface 144 of the cavity 142 may be not a flat surface, and the bottom surface 144 may be a concave surface.

In some examples, the bottom surface 144 of the cavity 142 is located higher than or leveled with a top surface 136 of the first passivation layer 130. In certain examples, the bottom surface 144 of the cavity 142 is located lower than the top surface 136 of the first passivation layer 130. For example, the redistribution layer 140 may be formed from Al or AlCu.

As shown in FIG. 1, the second passivation layer 150 covers the redistribution layer 130, the bottom surface 144 and the side surface 146 of the cavity 142, and the exposed portion of the first passivation layer 130 to protect the redistribution layer 130. For example, the second passivation layer 150 may be formed from silicon oxide, silicon nitride, or silicon oxynitride.

The cavity 142 of the redistribution layer 140 is V-shaped or U-shaped, and the included angle 9 between the side surface 146 and the bottom surface 144 of the cavity 142 is equal to about 90 degrees or greater than about 90 degrees, such that the coverage of the second passivation layer 150 is superior, and no void is formed in the second passivation layer 150 within the cavity 142 of the redistribution layer 140, thereby enhancing reliability of the semiconductor device 100.

Figure 2A:
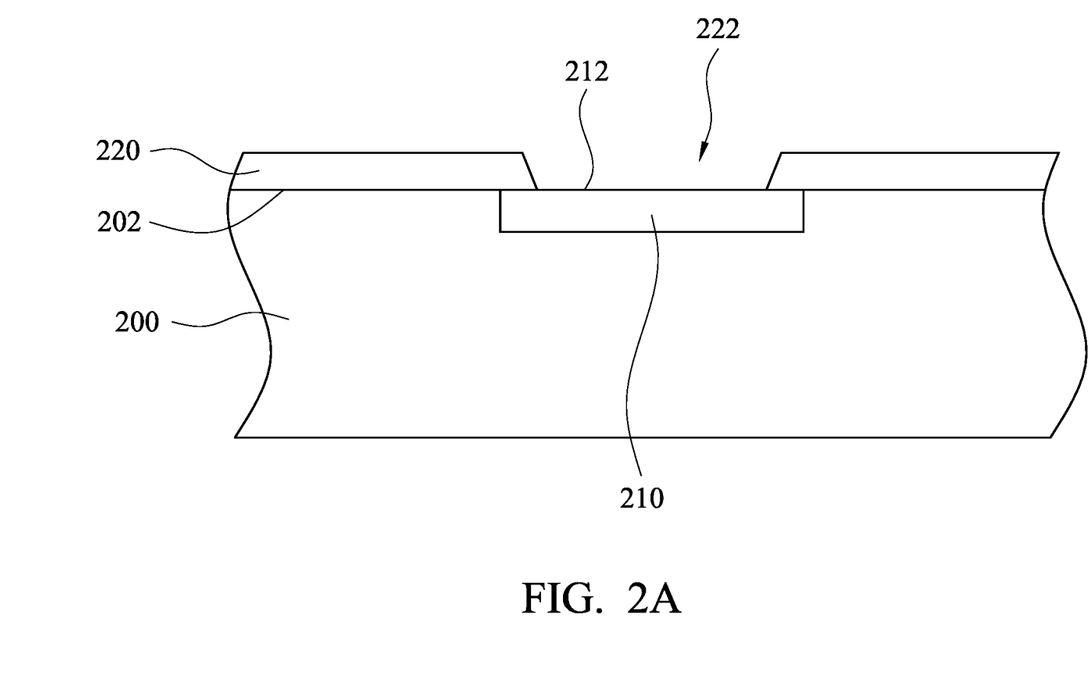
FIG. 2A through FIG. 2E are schematic cross-sectional views of intermediate stages showing a method for manufacturing a semiconductor device in accordance with various embodiments.

FIG. 2A through FIG. 2E are schematic cross-sectional views of intermediate stages showing a method for manufacturing a semiconductor device in accordance with various embodiments. As shown in FIG. 2A, a semiconductor substrate 200 is provided. The semiconductor substrate 200 may be formed to include a semiconductor base, one or more devices, various interlayer dielectric layers, and various interconnection layers, in which the devices may be disposed on the semiconductor base, the interlayer dielectric layers cover the semiconductor base and the devices, and the interconnection layers are disposed in or between the interlayer dielectric layers and are electrically connected to the devices. The semiconductor base may be composed of a single-crystalline semiconductor material or a compound semiconductor material. For example, silicon or germanium may be used as a material forming the semiconductor base. In certain examples, the semiconductor base may be a silicon on insulator base. The semiconductor substrate 200 has a top surface 202.

Referring to FIG. 2A again, a top metal layer 210 is formed in the top surface 202 of the semiconductor substrate 200. The top metal layer 210 may be the top one of the interconnection layers. In some examples, the top metal layer 210 is a metal bonding layer, and the top metal layer 210 is formed to include various bonding pads which are separated from each other. For example, the top metal layer 210 may be formed from Cu, Al, or AlCu.

As shown in FIG. 2A, a first passivation layer 220 is formed to cover the top metal layer 210 and the top surface 202 of the semiconductor substrate 200. The first passivation layer 220 is formed to have at least one via hole 222, in which the at least one via hole 222 passes through the first passivation layer 220 to expose at least one portion 212 of the top metal layer 210. In some exemplary examples, the first passivation layer 220 is formed using a deposition process, a photolithography process and an etching process. For example, the deposition process may be a chemical vapor deposition (CVD) process, and the etching process may be a dry etching process. In some exemplary examples, the top metal layer 210 is formed to include various bonding pads, and the first passivation layer 220 is formed to have various via holes 222, and the via holes 222 are formed to respectively expose the bonding pads. For example, the first passivation layer 220 may be formed from silicon oxide, silicon nitride, or silicon oxynitride.

Figure 2B:
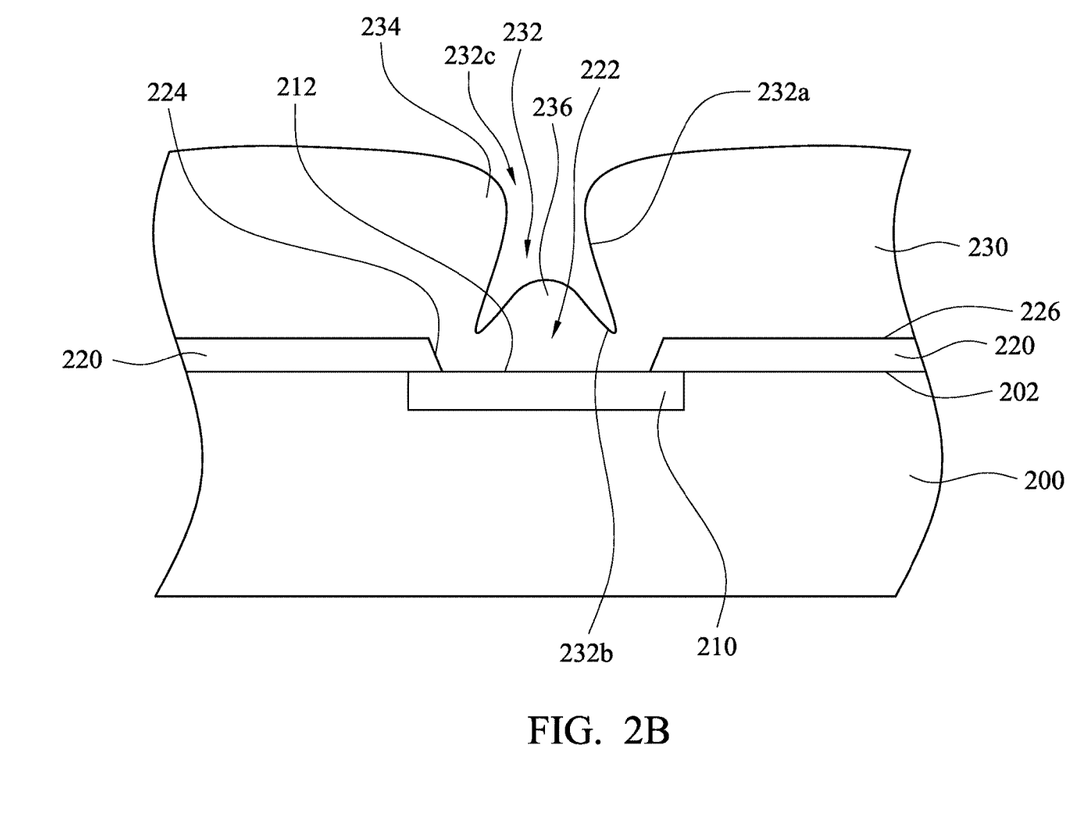

As shown in FIG. 2B, a redistribution layer 230 is formed to cover the first passivation layer 220, the portion 212 of the top metal layer 210 which is exposed by the via hole 222, and a side surface 224 of the via hole 222. In some exemplary examples, the redistribution layer 230 is formed using a sputtering process. In some examples, the redistribution layer 230 is formed to have at least one cavity 232 which is located over the at least one via hole 222 of the first passivation layer 220. The cavity 232 has a side surface 232a and a bottom surface 232b. In some exemplary examples, referring to FIG. 2B again, forming the redistribution layer 230 forms the bottom surface 232b of the cavity 232 being located higher than or leveled with a top surface 226 of the first passivation layer 220. In certain examples, forming the redistribution layer 230 forms the bottom surface 232b of the cavity 232 being located lower than the top surface 226 of the first passivation layer 220. The redistribution layer 230 is formed to include at least one overhang structure 234 over the at least one via hole 222. The overhang structure 234 is located on the side surface 232a of the cavity 232, and thus narrowing an opening 232c of the cavity 232. In some exemplary examples, the redistribution layer 230 is formed to further include at least one protrusion 236. The protrusion 236 is located on the bottom surface 232b of the cavity 232. For example, the redistribution layer 230 may be formed from Al or AlCu.

Figure 2C:
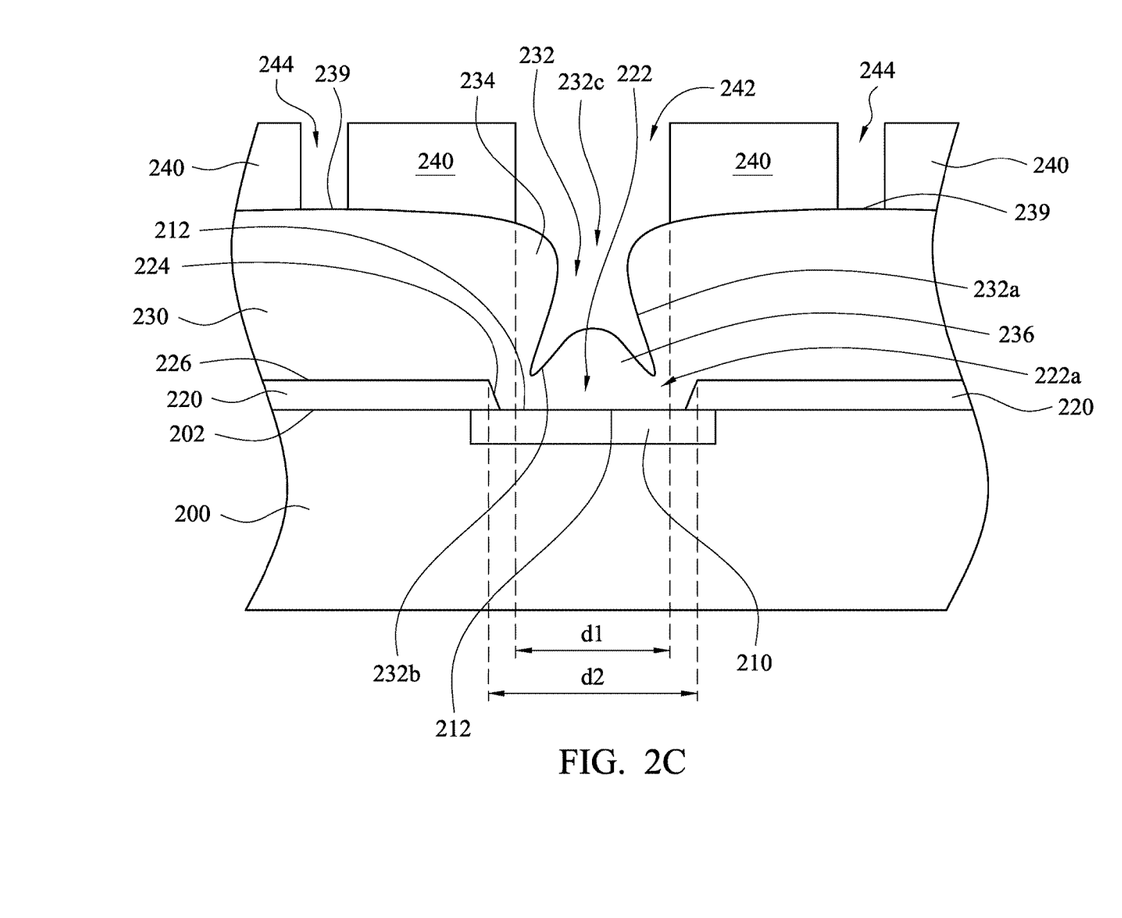
Figure 2D:
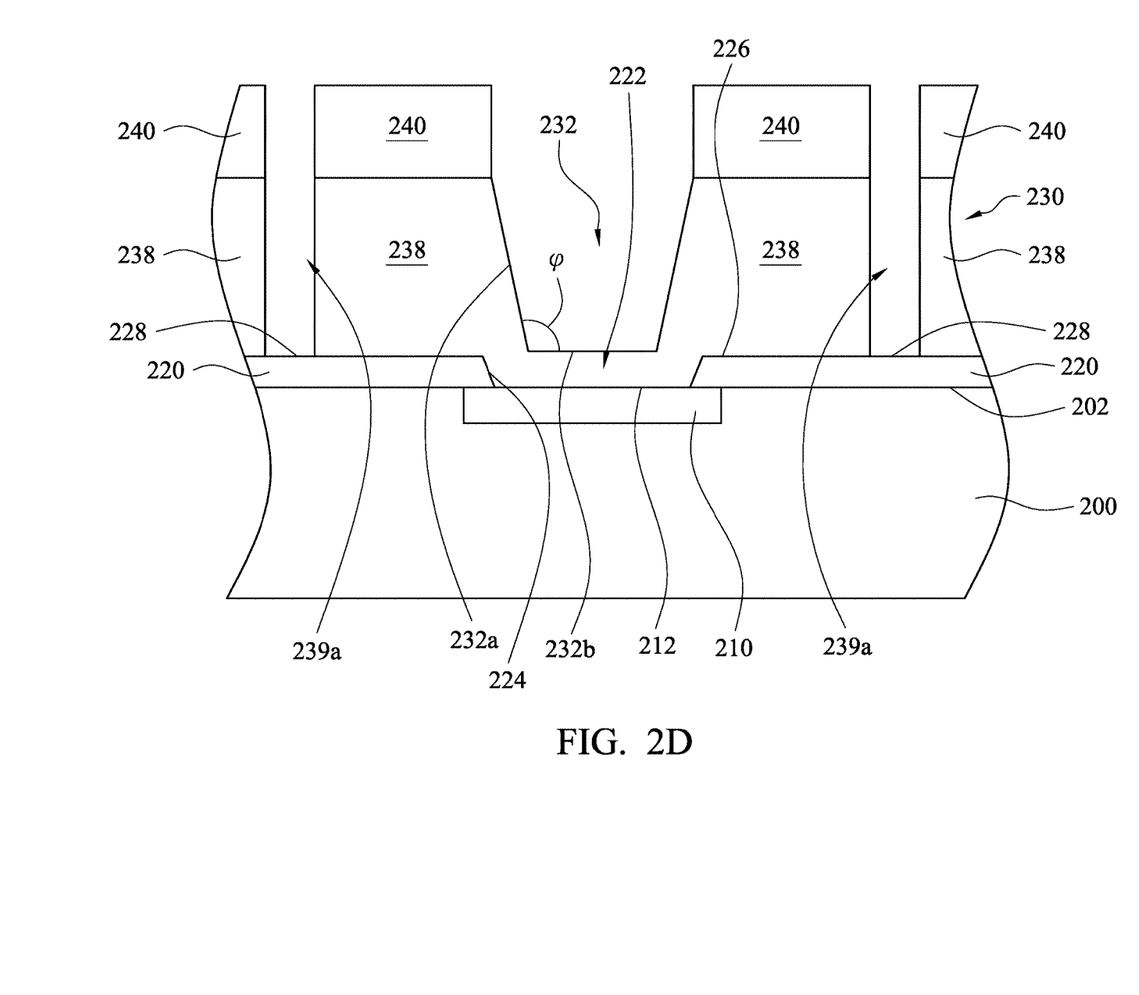

In some examples, referring to FIG. 2C and FIG. 2D simultaneously, the redistribution layer 230 is formed to be a redistribution bonding pad layer, and an etching process is performed on the redistribution layer 230 to remove at least one portion of the redistribution layer 230 to expose at least one portion 228 of the first passivation layer 220, so as to divide the redistribution layer 230 into various redistribution bonding pads 238. For example, the etching process may be a dry etching process. In the examples, the etching process is performed to remove the overhang structure 232 of the redistribution layer 230. In some exemplary examples, the etching process is performed to further remove the protrusion 236 of the redistribution layer 230, as shown in FIG. 2D. For example, the etching process is performed to form the cavity 232 of the redistribution layer 230 being V-shaped or U-shaped. In some exemplary examples, as shown in FIG. 2D, the etching process is performed to form an included angle φ between the side surface 232a and the bottom surface 232b of the cavity 232 being equal to about 90 degrees or greater than about 90 degrees. After the etching process is completed, the bottom surface 232b of the cavity 232 may be located higher than or leveled with the top surface 226 of the first passivation layer 220. In certain examples, after the etching process is completed, the bottom surface 232b of the cavity 232 may be located lower than the top surface 226 of the first passivation layer 220. In addition, after the etching process is completed, the bottom surface 232b of the cavity 232 may be not flat, and the bottom surface 232b of the cavity 232 may be, for example, a concave surface.

In some examples, in forming the redistribution bonding pads 238, and removing the overhang structure 234 and the protrusion 236, an etching hard mask layer 240 is formed on the redistribution layer 230. As shown in FIG. 2C, the etching hard mask layer 240 is formed to have at least one first hole 242 and at least one second hole 244, in which the at least one first hole 242 is formed to expose the cavity 232, and the at least one second hole 244 is formed to expose at least one portion 239 of the redistribution layer 230. In the example illustrated in FIG. 2C, the etching hard mask layer 240 is formed to have two second holes 244, and the second holes 244 expose two portions 239 of the redistribution layer 230. In some exemplary examples, the etching hard mask layer 240 is formed from photo resist, and the etching hard mask layer 240 is formed using a coating process and a photolithography process. In certain examples, the etching hard mask layer 240 is formed from a dielectric layer, and the etching hard mask layer 240 is formed using a deposition process, a photolithography process, and an etching process.

Referring to FIG. 2C again, the etching hard mask layer 240 may be formed to expose the overhang structure 234 and the protrusion 236 of the redistribution layer 230. In some examples, the first hole 242 of the etching hard mask layer 240 is formed to have a diameter d1 which is smaller than a diameter d2 of an opening 222a of the via hole 222. The first hole 242 is formed for removing the overhang structure 234 and the protrusion 236 of the redistribution layer 230, and the second holes 244 are formed for defining the redistribution layer 230.

After the etching mask layer 240 is completed, the etching process is performed on the redistribution layer 230 with the etching mask layer 240 to remove the portions 239, the overhang structure 234, and the protrusion 236 of the redistribution layer 230. The portions 239 of the redistribution layer 230 are removed to form through holes 239a to expose portions 228 of the first passivation layer 220. The overhang structure 234 and the protrusion 236 in the cavity 232 are removed to form the cavity 232 of the redistribution layer 230 being V-shaped or U-shaped. In the embodiments, by forming the first hole 242 of the etching hard mask layer 240 having the diameter d1 being smaller than the diameter d2 of the opening 222a of the via hole 222, removing the overhang structure 234 and the protrusion 236 does not expose the portion 212 of the top metal layer 210. In certain examples, removing the overhang structure 234 and the protrusion 236 does not expose the portion 212 of the top metal layer 210 by controlling the process parameters of the etching process.

After forming the redistribution bonding pads 238, and removing the overhang structure 234 and the protrusion 236 are completed, the etching mask layer 240 is removed by, for example, a stripping technique.

Figure 2E:
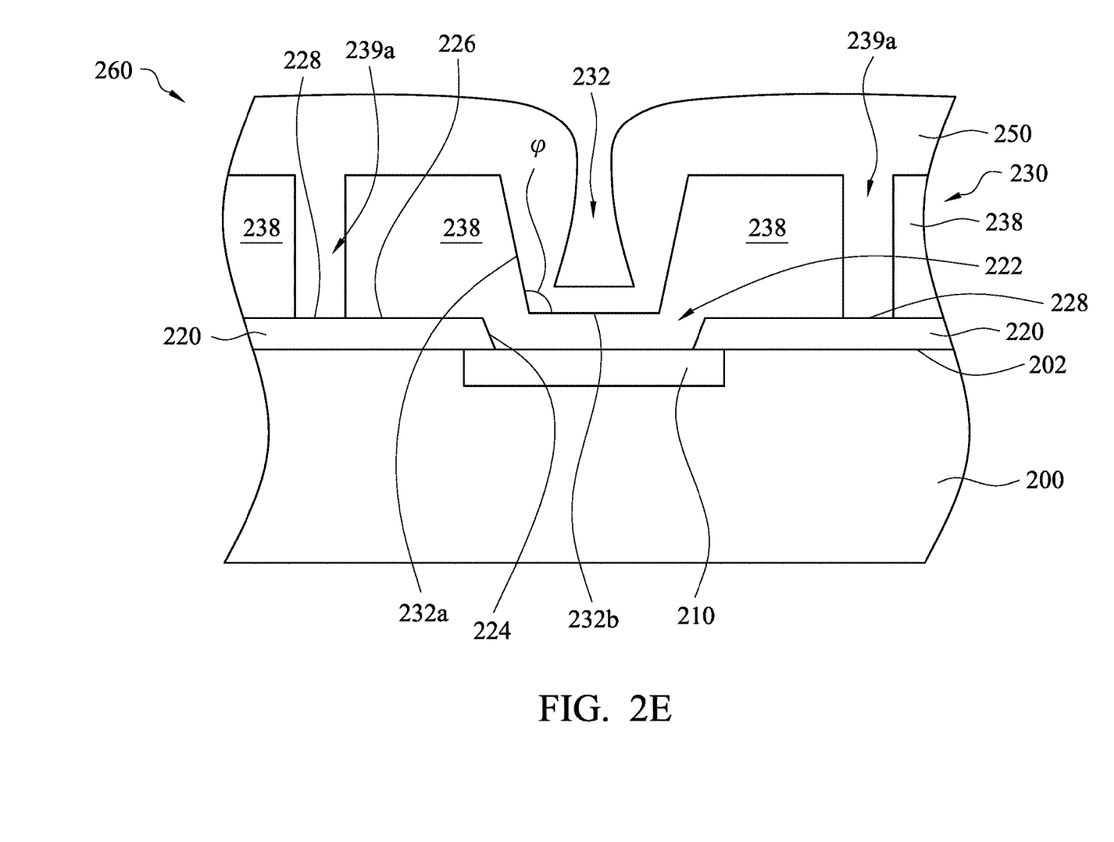

Then, as shown in FIG. 2E, a second passivation layer 250 is formed to cover the redistribution bonding pads 238 of the redistribution layer 230, the cavity 232, and the portions 228 of the first passivation layer 220 to protect the redistribution bonding pads 238 of the redistribution layer 230, so as to substantially complete a semiconductor device 260. For example, the second passivation layer 250 may be formed from silicon oxide, silicon nitride, or silicon oxynitride. In some exemplary examples, the second passivation layer 250 is formed using a deposition process, such as a chemical vapor deposition process.

The cavity 232 of the redistribution layer 230 is V-shaped or U-shaped, and the included angle φ between the side surface 232a and the bottom surface 232b of the cavity 232 is equal to about 90 degrees or greater than about 90 degrees, such that the second passivation layer 250 has superior coverage for the cavity 232 of the redistribution layer 230, and no void is formed in the second passivation layer 250 within the cavity 232 of the redistribution layer 230, thereby enhancing reliability of the semiconductor device 260.

Figure 3:
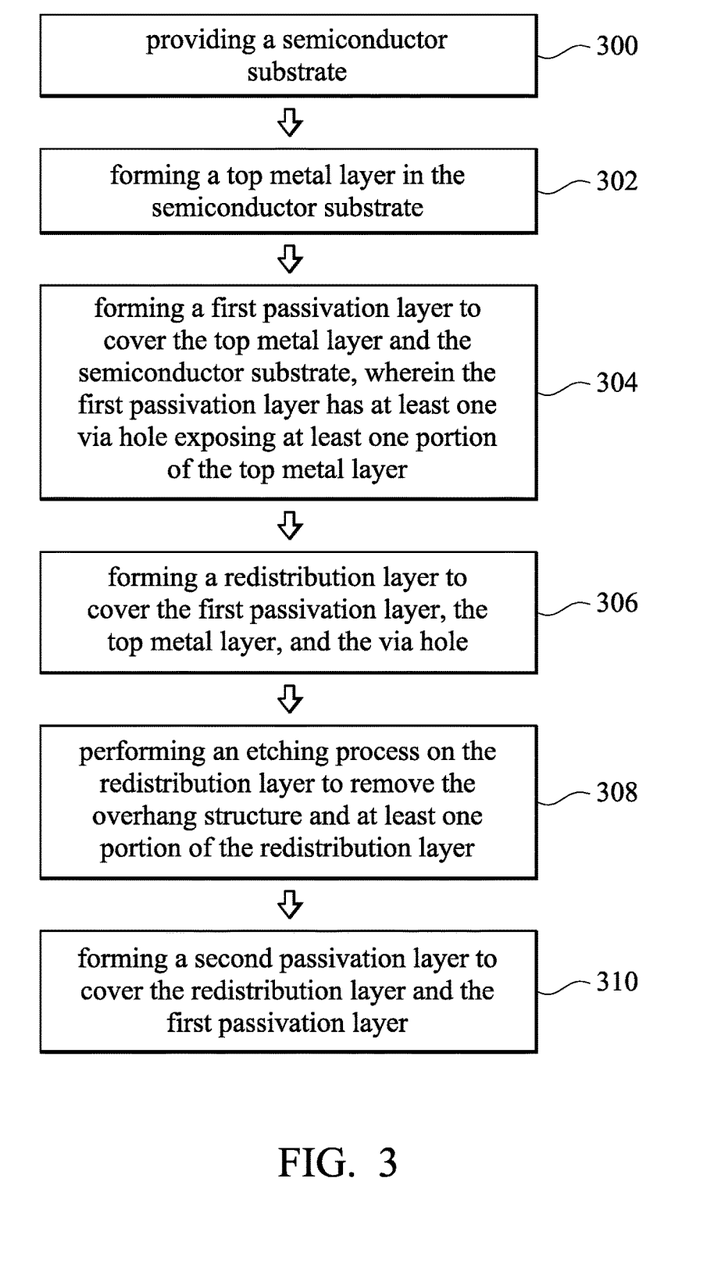
FIG. 3 is a flow chart of a method for manufacturing a semiconductor device in accordance with various embodiments.

Referring to FIG. 3 with FIG. 2A through FIG. 2E, FIG. 3 is a flow chart of a method for manufacturing a semiconductor device in accordance with various embodiments. The method begins at operation 300, where a semiconductor substrate 200 is provided. In some exemplary examples, as shown in FIG. 2A, the semiconductor substrate 200 is formed to include a semiconductor base, one or more devices, various interlayer dielectric layers, and various interconnection layers, in which the devices may be disposed on the semiconductor base, the interlayer dielectric layers cover the semiconductor base and the devices, and the interconnection layers are disposed in or between the interlayer dielectric layers and are electrically connected to the devices. The semiconductor base may be composed of a single-crystalline semiconductor material or a compound semiconductor material. In certain examples, the semiconductor base may be a silicon on insulator base. For example, silicon or germanium may be used as a material forming the semiconductor base. The semiconductor substrate 200 has a top surface 202.

At operation 302, as shown in FIG. 2A, a top metal layer 210 is formed in the top surface 202 of the semiconductor substrate 200 by, for example, a single damascene technique or a dual damascene technique. The top metal layer 210 may be the top one of the interconnection layers. In some examples, the top metal layer 210 is formed to be a metal bonding layer, and the top metal layer 210 is formed to include various bonding pads which are separated from each other. The top metal layer 210 may be formed from Cu, Al, or AlCu.

At operation 304, referring to FIG. 2A again, a first passivation layer 220 is formed to cover the top metal layer 210 and the top surface 202 of the semiconductor substrate 200. The first passivation layer 220 is formed to have at least one via hole 222 which passes through the first passivation layer 220 to expose at least one portion 212 of the top metal layer 210. In some exemplary examples, the first passivation layer 220 is formed using a deposition process, a photolithography process and an etching process. The deposition process may be a chemical vapor deposition process, and the etching process may be a dry etching process. In some exemplary examples, the top metal layer 210 is formed to include various bonding pads, and the first passivation layer 220 is formed to have various via holes 222 respectively exposing the bonding pads. The first passivation layer 220 may be formed from silicon oxide, silicon nitride, or silicon oxynitride.

At operation 308, as shown in FIG. 2B, a redistribution layer 230 is formed to cover the first passivation layer 220, the portion 212 of the top metal layer 210 which is exposed by the via hole 222, and a side surface 224 of the via hole 222 using, for example, a sputtering process. In some examples, the redistribution layer 230 is formed to have at least one cavity 232 which is located over the at least one via hole 222 of the first passivation layer 220. The cavity 232 has a side surface 232a and a bottom surface 232b. In some exemplary examples, forming the redistribution layer 230 forms the bottom surface 232b of the cavity 232 being located higher than or leveled with a top surface 226 of the first passivation layer 220. In certain examples, forming the redistribution layer 230 forms the bottom surface 232b of the cavity 232 being located lower than the top surface 226 of the first passivation layer 220. The redistribution layer 230 is formed to include at least one overhang structure 234 over the at least one via hole 222. The overhang structure 234 is located on the side surface 232a of the cavity 232, such that an opening 232c of the cavity 232 is narrowed by the overhang structure 234. In some exemplary examples, the redistribution layer 230 is formed to further include at least one protrusion 236 which is located on the bottom surface 232b of the cavity 232. For example, the redistribution layer 230 may be formed from Al or AlCu.

In some examples, referring to FIG. 2C and FIG. 2D simultaneously, the redistribution layer 230 is formed to be a redistribution bonding pad layer, and an etching process is performed on the redistribution layer 230 to remove at least one portion 239 of the redistribution layer 230 to expose at least one portion 228 of the first passivation layer 220, so as to divide the redistribution layer 230 into various redistribution bonding pads 238. The etching process may be a dry etching process. In the examples, the etching process is performed to remove the overhang structure 232 and the protrusion 236 of the redistribution layer 230, as shown in FIG. 2D. In some exemplary examples, the etching process is performed to form the cavity 232 of the redistribution layer 230 being V-shaped or U-shaped. For example, as shown in FIG. 2D, the etching process is performed to form an included angle φ between the side surface 232a and the bottom surface 232b of the cavity 232 being equal to about 90 degrees or greater than about 90 degrees. After the etching process is completed, the bottom surface 232b of the cavity 232 may be located higher than or leveled with the top surface 226 of the first passivation layer 220. In certain examples, after the etching process is completed, the bottom surface 232b of the cavity 232 may be located lower than the top surface 226 of the first passivation layer 220. In addition, after the etching process is completed, the bottom surface 232b of the cavity 232 may be not flat, and the bottom surface 232b of the cavity 232 may be, for example, a concave surface.

In some examples, in forming the redistribution bonding pads 238, and removing the overhang structure 234 and the protrusion 236, an etching hard mask layer 240 is formed on the redistribution layer 230. As shown in FIG. 2C, the etching hard mask layer 240 is formed to have a first hole 242 and second holes 244, in which the first hole 242 is formed to expose the cavity 232, and the second holes 244 are formed to expose portions 239 of the redistribution layer 230. In some exemplary examples, the etching hard mask layer 240 is formed from photo resist, and the etching hard mask layer 240 is formed using a coating process and a photolithography process. In certain examples, the etching hard mask layer 240 is formed from a dielectric layer, and the etching hard mask layer 240 is formed using a deposition process, a photolithography process, and an etching process.

As shown in FIG. 2C, the etching hard mask layer 240 may be formed to expose the overhang structure 234 and the protrusion 236 of the redistribution layer 230. In some examples, the first hole 242 of the etching hard mask layer 240 is formed to have a diameter d1 which is smaller than a diameter d2 of an opening 222a of the via hole 222.

Then, the etching process is performed on the redistribution layer 230 with the etching mask layer 240 to remove the portions 239, the overhang structure 234, and the protrusion 236 of the redistribution layer 230. The portions 239 of the redistribution layer 230 are removed to form through holes 239a to expose portions 228 of the first passivation layer 220. The overhang structure 234 and the protrusion 236 in the cavity 232 are removed to form the cavity 232 of the redistribution layer 230 being V-shaped or U-shaped. By forming the first hole 242 of the etching hard mask layer 240 having the diameter d1 being smaller than the diameter d2 of the opening 222a of the via hole 222, removing the overhang structure 234 and the protrusion 236 does not expose the portion 212 of the top metal layer 210. In certain examples, removing the overhang structure 234 and the protrusion 236 does not expose the portion 212 of the top metal layer 210 by controlling the process parameters of the etching process.

After forming the redistribution bonding pads 238, and removing the overhang structure 234 and the protrusion 236 are completed, the etching mask layer 240 is removed by, for example, a stripping technique.

At operation 310, as shown in FIG. 2E, a second passivation layer 250 is formed to cover the redistribution bonding pads 238 of the redistribution layer 230, the cavity 232, and the portions 228 of the first passivation layer 220 to protect the redistribution bonding pads 238 of the redistribution layer 230, so as to substantially complete a semiconductor device 260. The second passivation layer 250 may be formed from silicon oxide, silicon nitride, or silicon oxynitride. In some exemplary examples, the second passivation layer 250 is formed using a chemical vapor deposition process.

In accordance with an embodiment, the present disclosure discloses a method for manufacturing a semiconductor device. In this method, a semiconductor substrate having a top surface is provided. A top metal layer is formed in the top surface of the semiconductor substrate. A first passivation layer is formed to cover the top metal layer and the top surface of the semiconductor substrate, in which the first passivation layer is formed to have at least one via hole exposing at least one portion of the top metal layer. A redistribution layer is formed to cover the first passivation layer, the at least one portion of the top metal layer, and a side surface of the at least one via hole, in which the redistribution layer is formed to include at least one overhang structure over the at least one via hole. An etching process is performed on the redistribution layer to remove the at least one overhang structure and at least one portion of the redistribution layer, in which the at least one portion of the redistribution layer is removed to expose at least one portion of the first passivation layer. A second passivation layer is formed to cover the redistribution layer and the at least one portion of the first passivation layer.

In accordance with another embodiment, the present disclosure discloses a method for manufacturing a semiconductor device. In this method, a semiconductor substrate having a top surface is provided. A top metal layer is formed in the top surface of the semiconductor substrate. A first passivation layer is formed to cover the top metal layer and the top surface of the semiconductor substrate, in which the first passivation layer is formed to have at least one via hole exposing at least one portion of the top metal layer. A redistribution layer is formed to cover the first passivation layer, the at least one portion of the top metal layer, and a side surface of the at least one via hole, in which forming the redistribution layer forms the redistribution layer having at least one cavity over the at least one via hole, and the redistribution layer is formed to include at least one overhang structure on a side surface of the at least one cavity. An etching mask layer is formed on the redistribution layer, in which the etching mask layer is formed to have at least one first hole exposing the at least one cavity and at least one second hole exposing at least one portion of the redistribution layer. An etching process is performed on the redistribution layer with the etching mask layer to remove the at least one overhang structure and the at least one portion of the redistribution layer, in which the at least one portion of the redistribution layer is removed to expose at least one portion of the first passivation layer. The etching mask layer is removed. A second passivation layer is formed to cover the redistribution layer, the at least one cavity, and the at least one portion of the first passivation layer.

In accordance with yet another embodiment, the present disclosure discloses a semiconductor device. The semiconductor device includes a semiconductor substrate, a top metal layer, a first passivation layer, a redistribution layer, and a second passivation layer. The semiconductor substrate has a top surface. The top metal layer is disposed in the top surface of the semiconductor substrate. The first passivation layer covers the top metal layer and the top surface of the semiconductor substrate, in which the first passivation layer has at least one via hole exposing at least one portion of the top metal layer. The redistribution layer covers the first passivation layer, the at least one portion of the top metal layer, and a side surface of the at least one via hole, in which the redistribution layer has at least one cavity over the at least one via hole, the at least one cavity is V-shaped or U-shaped, and a bottom surface of the at least one cavity is located higher than or leveled with a top surface of the first passivation layer. The second passivation layer covers the redistribution layer and the at least one cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, the method comprising:
    providing a semiconductor substrate having a top surface;
    forming a top metal layer in the top surface of the semiconductor substrate;
    forming a first passivation layer to cover the top metal layer and the top surface of the semiconductor substrate, wherein the first passivation layer is formed to have at least one via hole exposing at least one portion of the top metal layer;
    forming a redistribution layer to cover the first passivation layer, said at least one portion of the top metal layer, and a side surface of the at least one via hole, wherein the redistribution layer is formed to comprise at least one overhang structure over the at least one via hole;
    performing an etching process on the redistribution layer to remove the at least one overhang structure and at least one portion of the redistribution layer, wherein said at least one portion of the redistribution layer is removed to expose at least one portion of the first passivation layer; and
    forming a second passivation layer to cover the redistribution layer and said at least one portion of the first passivation layer.

2. The method of claim 1, wherein each of the first passivation layer and the second passivation layer is formed from silicon oxide, silicon nitride, or silicon oxynitride.

3. The method of claim 1, wherein forming the redistribution layer is performed by a sputtering process.

4. The method of claim 1, wherein forming the redistribution layer forms the redistribution layer having at least one cavity over the at least one via hole, and the at least one overhang structure is located on a side surface of the at least one cavity.

5. The method of claim 4, wherein forming the redistribution layer forms the redistribution layer having at least one protrusion on a bottom surface of the at least one cavity.

6. The method of claim 5, wherein performing the etching process removes the at least one protrusion.

7. The method of claim 4, wherein performing the etching process forms an included angle between the side surface and a bottom surface of the at least one cavity, and the included angle is substantially equal to 90 degrees or greater than 90 degrees.

8. The method of claim 4, wherein performing the etching process further forms the at least one cavity being V-shaped or U-shaped.

9. The method of claim 4, wherein forming the redistribution layer forms a bottom surface of the at least one cavity which is located higher than or leveled with a top surface of the first passivation layer, and the bottom surface of the at least one cavity is formed to be a concave surface.

10. A method for manufacturing a semiconductor device, the method comprising:
    providing a semiconductor substrate having a top surface;
    forming a top metal layer in the top surface of the semiconductor substrate;
    forming a first passivation layer to cover the top metal layer and the top surface of the semiconductor substrate, wherein the first passivation layer is formed to have at least one via hole exposing at least one portion of the top metal layer;
    forming a redistribution layer to cover the first passivation layer, said at least one portion of the top metal layer, and a side surface of the at least one via hole, wherein forming the redistribution layer forms the redistribution layer having at least one cavity over the at least one via hole, and the redistribution layer is formed to comprise at least one overhang structure on a side surface of the at least one cavity;

forming an etching mask layer on the redistribution layer, wherein the etching mask layer is formed to have at least one first hole exposing the at least one cavity and at least one second hole exposing at least one portion of the redistribution layer;

performing an etching process on the redistribution layer with the etching mask layer to remove the at least one overhang structure and said at least one portion of the redistribution layer, wherein said at least one portion of the redistribution layer is removed to expose at least one portion of the first passivation layer;

removing the etching mask layer; and forming a second passivation layer to cover the redistribution layer, the at least one cavity, and the at least one portion of the first passivation layer.

11. The method of claim 10, wherein forming the redistribution layer is performed by a sputtering process.

12. The method of claim 10, wherein forming the redistribution layer forms the redistribution layer having at least one protrusion on a bottom surface of the at least one cavity.

13. The method of claim 12, wherein performing the etching process removes the at least one protrusion.

14. The method of claim 12, wherein performing the etching process forms an included angle between the side surface and a bottom surface of the at least one cavity, and the included angle is substantially equal to 90 degrees or greater than 90 degrees.

15. The method of claim 10, wherein performing the etching process further forms the at least one cavity being V-shaped or U-shaped.

16. The method of claim 10, wherein the at least one first hole is formed to have a diameter which is smaller than a diameter of an opening of the at least one via hole.

17. The method of claim 10, wherein forming the redistribution layer forms a bottom surface of the at least one cavity which is located higher than or leveled with a top surface of the first passivation layer.

18. A method for manufacturing a semiconductor device, the method comprising:

forming a top metal layer in a top surface of a semiconductor substrate;

forming a first passivation layer to cover a first portion of the top metal layer and the top surface of the semiconductor substrate, wherein the first passivation layer is formed to expose a second portion of the top metal layer;

forming a redistribution layer to cover the first passivation layer and said second portion of the top metal layer, wherein the redistribution layer is formed to comprise at least one overhang structure over said second portion of the top metal layer;

performing an etching process to remove the at least one overhang structure and at least one portion of the redistribution layer, wherein said at least one portion of the redistribution layer is removed to expose at least one portion of the first passivation layer; and forming a second passivation layer to cover the redistribution layer and said at least one portion of the first passivation layer.

19. The method of claim 18, wherein forming the redistribution layer forms the redistribution layer having at least one cavity over said second portion of the top metal layer.

20. The method of claim 19, wherein forming the redistribution layer forms a bottom surface of the at least one cavity which is located higher than or leveled with a top surface of the first passivation layer.

* * * * *